United States Patent
Bayerer et al.

(10) Patent No.: US 7,078,795 B2
(45) Date of Patent: Jul. 18, 2006

(54) HIGH VOLTAGE MODULE AND METHOD FOR PRODUCING SAME

(75) Inventors: Reinhold Bayerer, Warstein (DE); Volker Gabler, Soest (DE); Thomas Licht, Warstein (DE)

(73) Assignee: Eupec Europaische Gesellschaft fur Leistungshalbleiter GmbH & Co. KG, Warstein-Belecke (DE)

(*) Notice: Subject to any disclaimer, the term of this patent is extended or adjusted under 35 U.S.C. 154(b) by 35 days.

(21) Appl. No.: 10/742,366

(22) Filed: Dec. 19, 2003

(65) Prior Publication Data

US 2004/0140116 A1 Jul. 22, 2004

Related U.S. Application Data

(63) Continuation of application No. PCT/EP02/06199, filed on Jun. 6, 2002.

(30) Foreign Application Priority Data

Jun. 25, 2001 (DE) .................................. 101 30 517

(51) Int. Cl.
*H01L 23/22* (2006.01)

(52) U.S. Cl. ............................ 257/687; 257/678

(58) Field of Classification Search ............... 257/678, 257/684, 687, 706, 717, 718, 727; 361/704, 361/705, 706, 697
See application file for complete search history.

(56) References Cited

U.S. PATENT DOCUMENTS

| | | | | |
|---|---|---|---|---|
| 5,294,374 A | * | 3/1994 | Martinez et al. | 252/516 |
| 5,580,493 A | | 12/1996 | Chu et al. | 252/511 |
| 5,641,997 A | * | 6/1997 | Ohta et al. | 257/788 |
| 6,201,696 B1 | * | 3/2001 | Shimizu et al. | 361/704 |

FOREIGN PATENT DOCUMENTS

| | | |
|---|---|---|
| DE | 199 58 915 A1 | 6/2000 |
| EP | 0 308 676 A2 | 8/1988 |
| EP | 0 921 565 A2 | 6/1999 |
| EP | 0 962 974 A2 | 12/1999 |
| WO | WO 00/24992 | 5/1999 |
| WO | WO 00/08686 | 2/2000 |

* cited by examiner

*Primary Examiner*—Douglas W. Owens
(74) *Attorney, Agent, or Firm*—Baker Botts L.L.P.

(57) ABSTRACT

A high-voltage module comprises a housing (9) which accommodates at least one structural component (4, 5) that is fastened on a metal-ceramics substrate from a ceramic layer (1) comprising a first main face (11) and a second main face (12) opposite said first main face (11), an upper metal layer (15) on the first main face (11) and a lower metal layer (16) on the second main face (12). The high-voltage module is further comprising on the outer edges (14) of the substrate either a cast from weakly conductive particles (17) and a gel, or a cast from particles having a high dielectric constant as compared to the cast gel (17), and a gel.

15 Claims, 3 Drawing Sheets

HIGH VOLTAGE MODULE AND METHOD FOR PRODUCING SAME

CROSS REFERENCE TO RELATED APPLICATION

This application is a continuation of copending International Application No. PCT/EP02/06199 filed Jun. 6, 2002 which designates the United States, and claims priority to German application DE101 30 517.6 filed Jun. 25, 2001.

TECHNICAL FIELD OF THE INVENTION

The invention relates to a high-voltage module with a housing for holding at least one component which is fixed to a substrate made from a ceramic layer with a first main face and a second main face situated opposite the first main face, a top metal layer on the first main face and a bottom metal layer on the second main face, the circuit assembly being encapsulated in a soft casting compound, and to a method for the manufacture of a high-voltage module of this kind.

BACKGROUND OF THE INVENTION

In electronics and electrical engineering, components are usually mounted on boards or on a two-sided metallized insulating material. Two-sided copper-coated ceramic boards are therefore used, for example, in power electronics, where the ceramic board constitutes an insulator with a specified d 1-electric constant. The components are mounted on the structured metal layer and filled, for example, with casting compound.

Here, very high electrical field strengths occur, particularly at the side edges of the top metal layer, due to the high voltages applied between the contact surfaces. For example, the field strength is up to 50 kV/mm at a voltage of 5000 V. At this field strength, the insulation requirements, which are placed on the power module, can no longer be reliably fulfilled due to the breakdown voltage at the junction with the casting compound, i.e. to the insulator, being exceeded.

FIG. 1 shows a typical construction of an encapsulated circuit element according to the prior art. The AlN substrate shown in FIG. 1, on which the circuit is mounted, is designated by 1. The substrate is a high-quality insulator, usually a ceramic board, which has a dielectric constant of about 10.

The insulator 1 is fixed to a copper baseplate 2 (or AlSiC baseplate), for example, which serves to provide both mechanical stability for the circuit and also thermal connection of the circuit to the outside. The copper baseplate 2 thus secures the components of the circuit on the one hand and, on the other, ensures that heat from the components is conducted away to a heat sink, which is not shown in FIG. 1. At the same time, the AlN substrate is joined to the copper baseplate 2 by means of solder connections 3.

In the form shown, the electronic circuit includes an IGBT 4 and a diode 5, which are rated, for example, for voltages of 1600 V. These components 4 and 5 are connected together, for example, with aluminum thick wire bonding wires 6 and/or by means of metallizing on the insulator. In the case of thick wire bonding, the aluminum wires preferably have a thickness of about 200 to 500 μm.

The whole circuit assembly according to the prior art is encapsulated in a soft casting compound 8, for example made from silicone gel, and subsequently fitted into a housing 9 made of plastic. The plastic housing 9 is preferably fixed directly on the copper baseplate 2 and is filled with a hard casting compound 7. Only the feed conductors with load current contacts 10 are fed out of the plastic housing 9. The load current contacts 10 are also connected to the circuit in the housing 9 by means of solder connections 3.

With a housing of this kind according to the prior art, high field strengths generally occur at the edges, points and structures of voltage-carrying elements, which have a small bending radius. Field strengths, which can exceed the local dielectric strength, occur particularly at the edge of the substrate 14, i.e. at the metallization edge, but also due on the one hand to the geometrical arrangement and on the other, to the material characteristics. The consequence is electrical flashovers, which can cause local damage and thus a loss of insulation of the module.

The profile of the equipotential lines in such a construction according to the prior art is shown in FIG. 2 in an enlarged section of the illustration in FIG. 1. A top and a bottom metal layer 15, 16 are located on the top and bottom surfaces 11, 12 of the AlN ceramic layer 1 resulting in a "sandwich construction". The bottom metal layer 16 of the construction shown in FIG. 2 can be in thermal contact with the copper baseplate 2 and thus with a heat sink by means of a solder connection.

It can be seen from the density of the equipotential lines 13 in FIG. 2 that a high field strength prevails at the edges 14 in this construction according to the prior art so that uncontrolled discharges occur when a material-dependent breakdown field strength is exceeded, as a result of which the sensitive components of the circuit can be destroyed.

In WO 00/08686 a method is disclosed for shifting the break-down voltage to higher values by reducing the field strength at the edges of the metallization 14. To achieve this, a dielectric layer with a second dielectric constant is provided arranged on the ceramic layer, which borders the top metallization. As a result of this, the maximum field strength at the junction from the substrate (ceramic and metallization) to its environment can be reduced.

SUMMARY OF THE INVENTION

The present invention is based on the object of improving a high-voltage module of the kind mentioned in the introduction in such a way that high peak field strengths, which occur on the metallization of the ceramic substrate and other parts due to edges, are substantially prevented.

This object can be solved by a high-voltage module comprising a housing for holding at least one component, which is fixed to a substrate made from a ceramic layer with a first main face and a second main face situated opposite the first main face, a top metal layer on the first main face and a bottom metal layer on the second main face, the circuit assembly being encapsulated in a soft casting compound wherein the soft casting compound, at least in the area of the outside edges of the substrate, consists of a mixture of a gel and weakly conductive particles.

The weakly conducting particles can be made of conducting plastics, resins and/or elastomers. The weakly conductive particles or the electrically insulating particles may have a size of about 50–300 μm. The weakly conductive particles or the electrically insulating particles may have a widely distributed grain size. The gel can be a silicone gel. The soft casting compound may have weakly conductive particles or electrically insulating particles only in the area of the outside edges of the substrate. The whole of the soft casting compound may contain weakly conductive particles or electrically insulating particles. The high voltage module may comprise a housing in which at least one component is located, which is fixed to a substrate made from a ceramic layer with a first main face and a second main face situated opposite the first main face, a top metal layer on the first main face and a bottom metal layer on the second main face, the entire circuit assembly and in particular the area of the edges having a soft casting compound made from a mixture of a silicone gel and weakly conductive plastic particles and being filled with a hard casting compound.

The object can further be achieved by a high-voltage module comprising a housing for holding at least one component, which is fixed to a substrate made from a ceramic layer with a first main face and a second main face situated opposite the first main face, a top metal layer on the first main face and a bottom metal layer on the second main face, the circuit assembly being encapsulated in a soft casting compound, wherein the soft casting compound, at least in the area of the outside edges of the substrate, consists of a mixture of a gel and electrically insulating particles with a higher dielectric constant than the gel.

The electrically insulating particles may have a dielectric constant of at least 2.0, in particular of more than 6. The electrically insulating particles can be made of glass beads, glass granulate, non-conducting plastics, resins, elastomers, oxides and/or non-oxide ceramics. The gel can be a silicone gel. The soft casting compound may have weakly conductive particles or electrically insulating particles only in the area of the outside edges of the substrate. The whole of the soft casting compound may contain weakly conductive particles or electrically insulating particles. The high-voltage module may comprise a housing in which at least one component is located, which is fixed to a substrate made from a ceramic layer with a first main face and a second main face situated opposite the first main face, a top metal layer on the first main face and a bottom metal layer on the second main face, the entire circuit assembly and in particular the area of the edges having a soft casting compound made from a mixture of a silicone gel and weakly conductive plastic particles and being filled with a hard casting compound.

The object can further be achieved by a method for manufacturing a high-voltage module with a housing in which at least one component is located, the method comprising the steps of:
fixing the at least one component to a substrate made from a ceramic layer with a first main face and a second main face situated opposite the first main face, a top metal layer on the first main face and a bottom metal layer on the second main face,
encapsulating the component in a soft casting compound, wherein
in a first step filling the high-voltage module at least partially with weakly conductive particles at least in the area of the outside edges of the substrate and subsequently,
in a further step, encapsulating the high-voltage module with a gel.

The object can further be achieved by a method for manufacturing a high-voltage module with a housing in which at least one component is located, the method comprising the steps of:
fixing the at least one component to a substrate made from a ceramic layer with a first main face and a second main face situated opposite the first main face, a top metal layer on the first main face and a bottom metal layer on the second main face,
encapsulating the component in a soft casting compound, wherein
in a first step, filling the high-voltage module at least partially with particles of high dielectric constant at least in the area of the outside edges of the substrate and subsequently,
in a further step, encapsulating the high-voltage module with a gel.

In the methods, the high-voltage module can be encapsulated with a gel in a vacuum process.

An advantage of the invention is that the insulation protection for the high-voltage module can be realized with comparatively little effort and thus cost-effectively.

The high-voltage module according to the invention has a housing in which at least one component is located. The component or components are fixed on a (metal-ceramic) substrate. Said (metal-ceramic) substrate consists of
a ceramic layer with a first main face and a second main face situated opposite the first main face,
a top metal layer on the first main face and a bottom metal layer on the second main face.

The entire circuit construction is encapsulated in a soft casting compound. Here, the soft casting compound, at least in the area of the outside edges of the (metal-ceramic) substrate, consists either
of a mixture containing a gel as well as weakly conducting particles, or alternatively
of a mixture containing a gel as well as particles with high dielectric constant in comparison with the gel.

Thus, along with the gel, the whole of the soft casting compound can also have the weakly conductive particles or the electrically insulating particles spatially limited on one side, i.e. in the area of the outside edges of the (metal-ceramic) substrate, while pure gel can be present outside the area of the outside edges. Alternatively, however, the whole of the soft casting compound can contain weakly conductive particles or electrically insulating particles.

Thus, according to the method according to the invention, the high-voltage module is first filled with weakly conductive particles to the level of the outside edges of the substrate, ensuring by means of a vibration process, for example, that the particles at the edge areas of the substrate are optimally distributed. The module is then encapsulated with a suitable gel, for example a silicone gel, in particular in a vacuum process. This ensures that after the casting compound (gel) has set, a weak conductivity remains in the casting compound.

The electrical conductivity of the weakly conductive particles is chosen so that the insulation resistances—according to the relevant standards—are maintained. This is achieved, for example, by the weakly conductive particles constituting a mixture of conductive and non-conductive material. Preferred weakly conductive particles are made of conducting plastics, resins or elastomers.

As an alternative to the conductive particles, electrically insulating particles with very much higher dielectric constants than the gel are used. Here, values of more than 2, for example, but in particular of more than 6, such as a value of 8 perhaps, are looked upon as being high dielectric constants. The resulting dielectrically inhomogeneous structure has the characteristic of changing the field distribution by means of a quasi-scatter effect and of homogenizing the fields. By this means, the required field reduction at the edges of the metal parts on the ceramic is achieved.

Preferred electrically insulating particles are glass beads or glass granulates or non-conducting plastics, resins, elastomers or oxide and non-oxide ceramics. Glass beads or glass granulates have a dielectric constant of about 8.

The particle size of the electrically insulating particles or the weakly conductive particles is chosen to be in the range from 50–300 µm, for example. As a result, in particular a maximum surface area of the particles and thus contact between the particles is ensured so that the gel can fill the intermediate spaces during casting and that ultimately good elasticity of the mixture of particles and casting corn pound persists. Preferably, however, the particles are not mainly of one single grain size but are subject to a grain size distribution so that the different grain sizes allow more free spaces.

As a result of the casting compound solution described above using electrically insulating particles or weakly conductive particles, high peak field strengths, which occur on the metallization of the ceramic substrate and other parts due to edges, are essentially prevented. A high-voltage module can thus be realized for an insulation of at least about 6 $kV_{rms}$. The advantage of the method according to the invention consists particularly in the comparatively easy implementation, in particular compared to the solution proposed in WO 00/08686.

To achieve an improvement of the field distribution by coating the edges of dielectric layers requires extremely precise coating methods. In contrast to this, a considerably more economical and thus more cost-effective solution is provided in the present method by simply pouring in electrically insulative particles or weakly conductive particles into the module, vibration to produce the optimum distribution of the particles and subsequent encapsulation with a suitable gel.

BRIEF DESCRIPTION OF THE DRAWINGS

The invention is described in more detail in the following with reference to the exemplary embodiments shown in the figures of the drawing, in which.

DETAILED DESCRIPTION OF THE PREFERRED EMBODIMENTS

Figure 1:
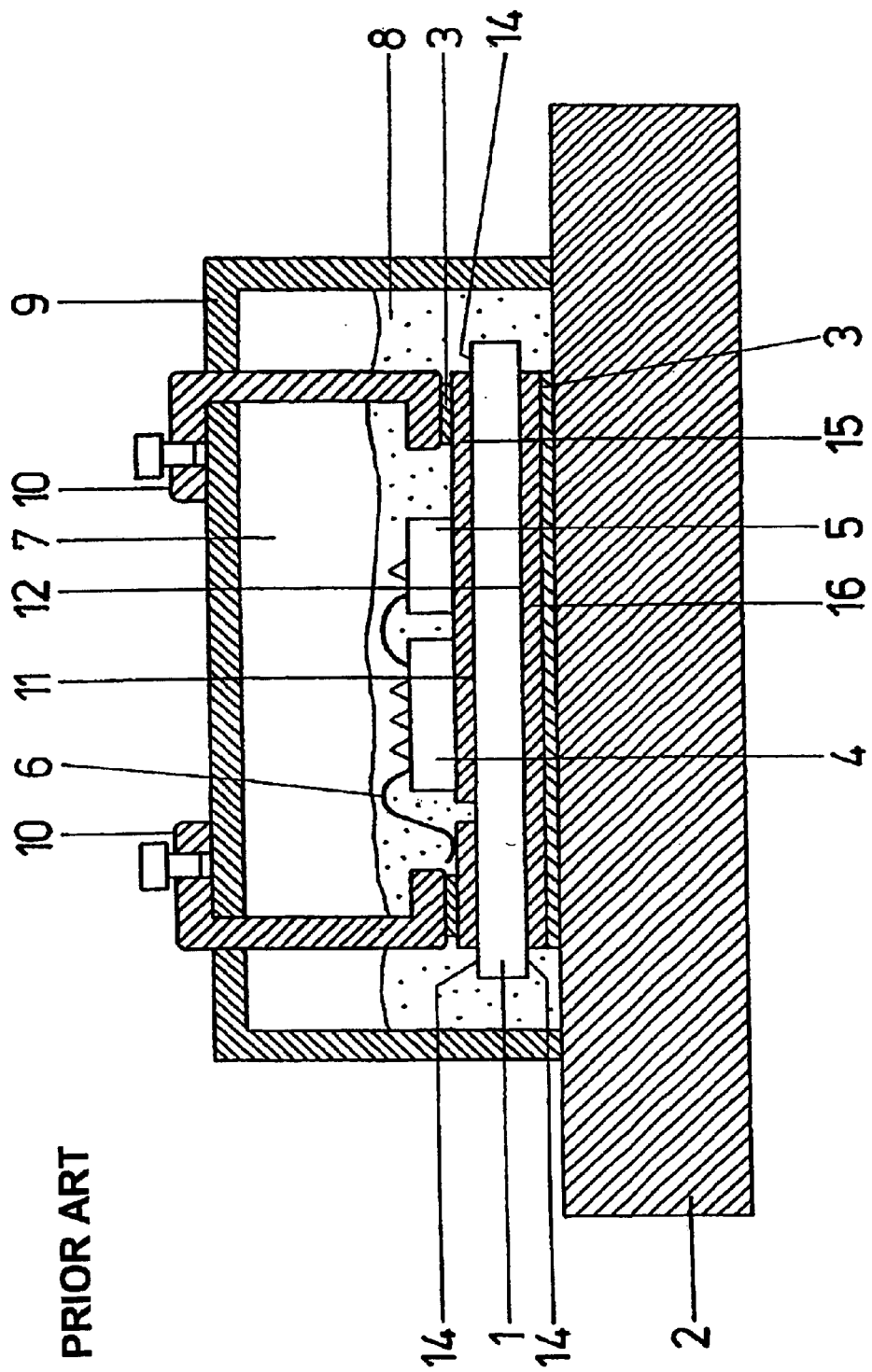
FIG. 1 shows a typical construction of an encapsulated circuit element according to the prior art.
Figure 2:
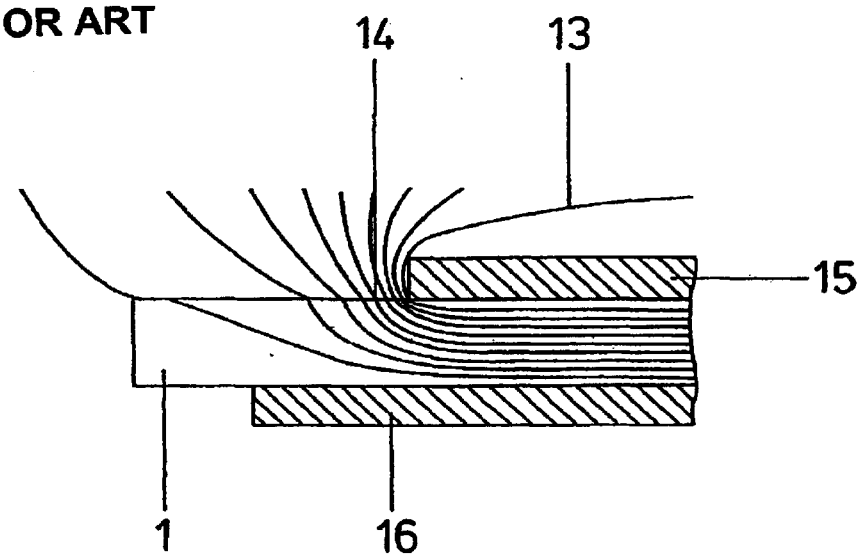
FIG. 2 shows the field profile in a construction according to the prior art, and FIGS. 3a to 3c each show a detail of a preferred arrangement of the high-voltage module according to the invention for a suitable component.
Figure 3A:
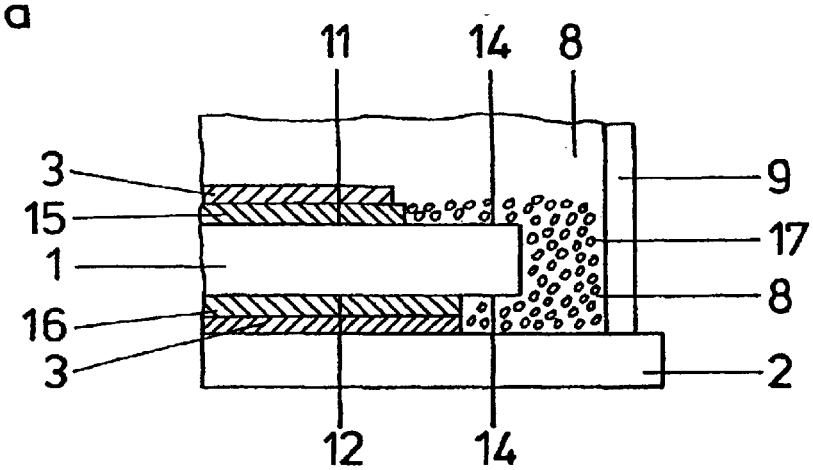

FIG. 3a incorporates a preferred embodiment in which electrically insulating particles or weakly conductive particles with essentially the same particle size are used. The ceramic layer 1 is connected to the baseplate 2 by means of the bottom metal layer 16 and the solder connection 3 (to the load current constructs 10, not shown). The edge of the top metal layer 15 is at greater distance from the edge of the ceramic layer 1 than the edge of the bottom metal layer 16. Alternatively, however, the top metal layer 15 can maybe be at a shorter or equal distance from the edge of the ceramic layer 1 than the edge of the bottom metal layer 16.

A top and a bottom metal layer 15, 16 are located on the top and bottoms surfaces 11, 12 of the AlN ceramic layer 1 resulting in a "sandwich construction". At the outside edges 14, the module is filled, for example, with a glass granulate 17 of about 100–120 µm up to the level of the top solder connection 3 and encapsulated with a silicone gel 8.

Figure 3B:
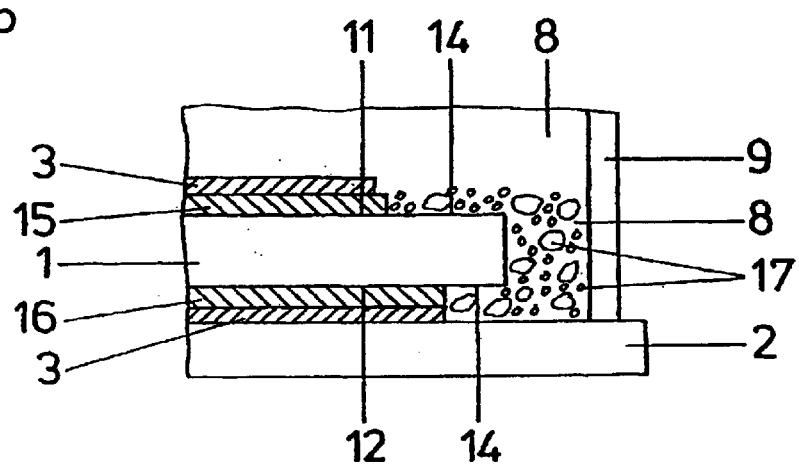

FIG. 3b shows a preferred embodiment in which electrically insulating particles or weakly conducting particles with different particle size are used. This results in a gradient mixture with large as well as small scatter centers. The ceramic layer 1 is again connected to the baseplate 2 by means of the bottom metal layer 16 and the solder connection 3. The edge of the top metal layer 15 is at a greater distance from the edge of the ceramic layer 1 than the edge of the bottom metal layer 16. Alternatively, however, the top metal layer 15 maybe at a shorter or equal distance from the edge of the ceramic layer 1 than the edge of the bottom metal layer 16.

A top and a bottom metal layer 15, 16 are located on the top and bottom surfaces 11, 12 of the AlN ceramic layer 1 resulting in a "sandwich construction". At the outside edges 14, the module is filled, for example, with a mixture of weakly conducting plastic granulate 17 of different particle size, for example from 80–90 µm and 250–300 µm, up to the level of the top solder connection 3 and encapsulated with a silicone gel 8.

Figure 3C:
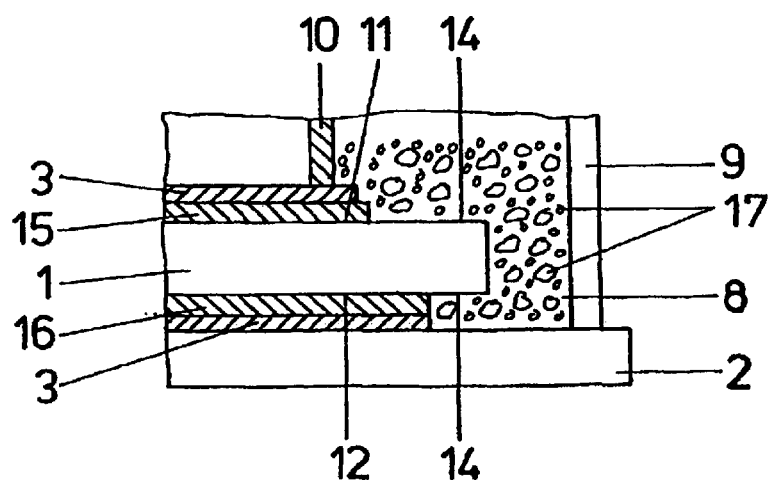

FIG. 3c shows a particularly preferred embodiment corresponding to FIG. 3b in which electrically insulating particles or weakly conducting particles with different particle size are filled to above the top solder connection 3 and encapsulated with a silicone gel 8.

By means of the casting compound made from gel according to the invention as well as the weakly conductive particles or the electrically insulating particles, a dielectrically inhomogeneous structure is produced, which has the characteristic of changing the field distribution by means of a quasi-scatter effect and of homogenizing the fields. This results in the required field reduction at the edges of the metal parts on the ceramic.

The ceramic layer 1—as already mentioned—is typically made of AlN. The thickness of the ceramic layer 1 is, for ex-ample, between 0.25–4 mm (typically 1 mm). The dielectric constant of the ceramic layer 1 is about 8.9. The thickness of the top and bottom metal layer 15, 16 is set to about 300 µm in each case. The dielectric constant of the silicone gel 8 is about 3.

We claim:

1. A high-voltage module comprising a housing for holding at least one component, which is fixed to a substrate made from a ceramic layer with a first main face and a second main face situated opposite the first main face, a top metal layer on the first main face and a bottom metal layer on the second main face, the circuit assembly being encapsulated in a soft casting compound wherein the soft casting compound, at least in the area of the outside edges of the substrate, consists of a mixture of a gel and weakly conductive particles.

2. The high-voltage module as claimed in claim 1, wherein the weakly conducting particles are made of conducting plastics, resins and/or elastomers.

3. The high-voltage module as claimed in claim 1, wherein the weakly conductive particles or the electrically insulating particles have a size of about 50–300 µm.

4. The high-voltage module as claimed in claim 1, wherein the weakly conductive particles or the electrically insulating particles have a widely distributed grain size.

5. The high-voltage module as claimed in claim 1, wherein the gel is a silicone gel.

6. The high-voltage module as claimed in claim 1, wherein the soft casting compound has weakly conductive particles or electrically insulating particles only in the area around the outside edges of the substrate.

7. The high-voltage module as claimed in claim 1, wherein the whole of the soft casting compound contains weakly conductive particles or electrically insulating particles.

8. The high-voltage module as claimed in claim 1, comprising a housing in which at least one component is located, which is fixed to a substrate made from a ceramic layer with a first main face and a second main face situated opposite the first main face, a top metal layer on the first main face and a bottom metal layer on the second main face, the entire circuit assembly and in particular the area of the edges having a soft casting compound made from a mixture of a silicone gel and weakly conductive plastic particles and being filled with a hard casting compound.

9. A high-voltage module comprising a housing for holding at least one component, which is fixed to a substrate made from a ceramic layer with a first main face and a second main face situated opposite the first main face, a top metal layer on the first main face and a bottom metal layer on the second main face, the circuit assembly being encapsulated in a soft casting compound, wherein the soft casting compound, at least in the area of the outside edges of the substrate, consists of a mixture of a gel and electrically insulating particles with a higher dielectric constant than the gel.

10. The high-voltage module as claimed in claim 9, wherein the electrically insulating particles have a dielectric constant of at least 2.0, in particular of more than 6.

11. The high-voltage module as claimed in claim 9, wherein the electrically insulating particles are made of glass beads, glass granulate, non-conducting plastics, resins, elastomers, oxides and/or non-oxide ceramics.

12. The high-voltage module as claimed in claim 9, wherein the gel is a silicone gel.

13. The high-voltage module as claimed in claim 9, wherein the soft casting compound has weakly conductive particles or electrically insulating particles only in the area around the outside edges of the substrate.

14. The high-voltage module as claimed in claim 9, wherein the whole of the soft casting compound contains weakly conductive particles or electrically insulating particles.

15. The high-voltage module as claimed in claim 9, comprising a housing in which at least one component is located, which is fixed to a substrate made from a ceramic layer with a first main face and a second main face situated opposite the first main face, a top metal layer on die first main face and a bottom metal layer on the second main face, the entire circuit assembly and in particular the area of the edges having a soft casting compound made from a mixture of a silicone gel and weakly conductive plastic particles and being filled with a hard casting compound.

* * * * *

UNITED STATES PATENT AND TRADEMARK OFFICE
CERTIFICATE OF CORRECTION

| | | |
|---|---|---|
| PATENT NO. | : 7,078,795 B2 | Page 1 of 1 |
| APPLICATION NO. | : 10/742366 | |
| DATED | : July 18, 2006 | |
| INVENTOR(S) | : Reinhold Bayerer et al. | |

It is certified that error appears in the above-identified patent and that said Letters Patent is hereby corrected as shown below:

Title page, [56] under FOREIGN PATENT DOCUMENTS, please delete "WO 00/24992", and replace with --WO 99/24992--.

Signed and Sealed this

Thirtieth Day of December, 2008

JON W. DUDAS
*Director of the United States Patent and Trademark Office*